Figure 1:
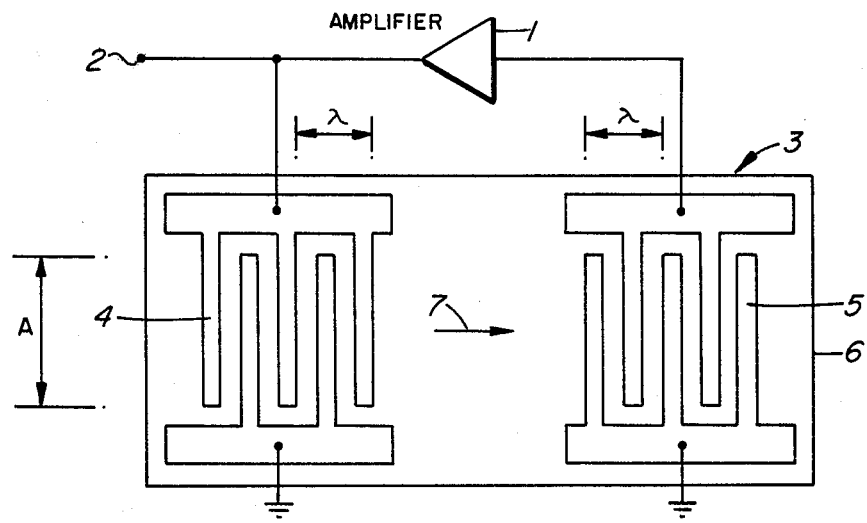

United States Patent [19]

Suthers

[11] 4,405,874
[45] Sep. 20, 1983

[54] SURFACE ACOUSTIC WAVE (SAW) DEVICES HAVING SERIES-CONNECTED INTER-DIGITAL TRANSDUCERS

[75] Inventor: Mark S. Suthers, Lanark, Canada

[73] Assignee: Northern Telecom Limited, Montreal, Canada

[21] Appl. No.: 353,075

[22] Filed: Mar. 1, 1982

[51] Int. Cl.³ .............................................. H03H 9/25
[52] U.S. Cl. ................................ 310/313 B; 333/151; 333/154
[58] Field of Search ............ 310/313 B, 313 R, 313 C, 310/313 D; 333/42, 195, 147, 186, 189, 191, 194, 193, 151, 154, 145; 367/161, 163, 167

[56] References Cited

U.S. PATENT DOCUMENTS

| | | | |
|---|---|---|---|
| 3,582,540 | 6/1971 | Adler | 310/313 B |
| 3,675,054 | 7/1972 | Jones et al. | 310/313 B |
| 4,006,438 | 2/1977 | Bennett | 333/72 |
| 4,028,649 | 6/1977 | Komatsu et al. | 333/72 |
| 4,126,800 | 11/1978 | Shiokawa et al. | 310/313 B |
| 4,357,584 | 11/1982 | Murray et al. | 333/195 |

OTHER PUBLICATIONS

Lakin, K. M., "A new Interdigital Electrode Technology" IEEE Trans. MTT, 22 (Aug. 74), pp. 763-767.

Primary Examiner—J. D. Miller
Assistant Examiner—D. L. Rebsch
Attorney, Agent, or Firm—R. John Haley

[57] ABSTRACT

To enable increased power coupling into a SAW device for which voltage breakdown is a limiting factor in determining the maximum power which can be coupled, each transducer of the SAW device is replaced by a plurality of series-connected inter-digital transducers (IDTs). For operation in an Nth harmonic mode, there may be N series-connected IDTs which are offset from one another by 1/N wavelengths of the fundamental frequency for which the individual IDTs are designed; for high frequency SAW devices, this further increases the power which can be coupled into the device. The SAW device is particularly useful in a delay-line oscillator to constitute a microwave source for a local oscillator in a radio repeater.

8 Claims, 4 Drawing Figures

SURFACE ACOUSTIC WAVE (SAW) DEVICES HAVING SERIES-CONNECTED INTER-DIGITAL TRANSDUCERS

This invention relates to surface acoustic wave (SAW) devices.

The size of the inter-digital transducers (IDTs) of a SAW device is reduced as the designed frequency of operation of the device is increased. For a SAW device designed for operation at a high frequency, such as 2.45 GHz, the small size of the IDTs presents severe limitations on the accuracy and ease with which the device can be produced, and in particular on the power which can be coupled into the device. The power limitation arises because the very small spacing of the IDT fingers results in the IDTs having very low breakdown voltages.

These limitations can be reduced by operating a SAW device in a harmonic mode. In "A SAW Step-Type Delay Line for Efficient High Order Harmonic Mode Excitation" by P. Naraine et al., 1980 Ultrasonics Symposium Proceedings, IEEE, pages 322 to 325 there is described a SAW step-type delay line in which the fingers of the input IDT are stepped to facilitate operation of the delay line at a selected harmonic frequency, with suppression of the fundamental frequency and undesired harmonic frequencies. Although the power which can be coupled into such a SAW device is increased in comparison to a fundamental-mode SAW device designed for the same operating frequency, this power is still very limited for high frequency SAW devices. Furthermore, the small finger length of the IDTs, which is necessitated by impedance matching considerations, and the stepped nature of the fingers of the input IDT give rise to significant diffraction losses.

Accordingly, an object of this invention is to provide an improved SAW device, in particular for operation at a high frequency.

According to one aspect of this invention, there is provided a surface acoustic wave device comprising a substrate and two transducer means disposed on a surface of the substrate for propagation of surface acoustic waves therebetween, each transducer means comprising a plurality of inter-digital transducers, electrically connected in series, for operation at a common frequency.

Thus in accordance with the invention, each transducer means comprises a plurality of IDTs connected in series with one another. A signal voltage applied to such a transducer means is divided by the IDTs so that only a fraction of the voltage appears across each IDT. Consequently the voltage which can be applied across the transducer means before voltage breakdown occurs is a multiple of the voltage which can be applied across a single IDT before voltage breakdown occurs. Because the power which can be coupled into the SAW device is proportional to the square of the applied voltage, this power is significantly increased for high frequency operation, for which voltage breakdown is the limiting factor in determining the power, by providing the plurality of IDTs connected in series.

In preferred embodiments of the inventon, the SAW device is operated at a harmonic above the fundamental frequency for which the IDTs are designed, thereby providing a further increase in the power which can be coupled into the device. In such embodiments preferably each transducer means comprises N inter-digital transducers, the 1st to Nth transducers of the two transducer means being respectively aligned with one another for propagation of N surface acoustic waves between the two transducer means, the transducers of at least one of the transducer means being offset with respect to one another to provide said N surface acoustic waves with N different path lengths between the two transducer means, said path lengths differing from one another to propagate the Nth harmonic of said common frequency between said two transducer means.

Although the SAW device is thus operated at a harmonic frequency in a similar manner to that described in the article referred to above, in this case the individual IDT fingers are not stepped, but rather the IDTs of the entire transducer means are offset or stepped with respect to one another. In consequence, diffraction losses are significantly reduced. The effects of diffraction can be further reduced by including an acoustic absorber disposed on said surface of the substrate between the paths of said N surface acoustic waves, whereby interference between surface acoustic waves from different IDTs is prevented.

Preferably the metallization ratio of the inter-digital transducers is selected to provide a maximum amplitude of the Nth harmonic of said common frequency of said surface acoustic waves. The metallization ratio is the ratio of the width of the fingers of each IDT to the width of the gap between the fingers. The selection of an appropriate metallization ratio is discussed in "Excitation of Elastic Surface Waves by Spatial Harmonics of Interdigital Transducers" by H. Engan, IEEE Trans. Electronic Devices, Vol. ED-16, pages 1014 to 1017, December 1969. Thus for example, a metallization ratio of 0.5 may be used for the 5th or 9th harmonic, a ratio of about 0.2 may be used for the 3rd harmonic, and a ratio of about 0.35 or 0.65 may be used for the 7th harmonic.

The IDTs of either only one, or of both, of the transducer means may be offset with respect to one another to provide said different path lengths.

According to another aspect of this invention there is provided a surface acoustic wave device for propagation of surface acoustic waves at the Nth harmonic above a fundamental frequency, said device comprising a substrate and two transducer means disposed on a surface of the substrate, each transducer means comprising N series-connected inter-digital transducers each for operation at said fundamental frequency, the 1st to Nth transducers of the two transducer means being respectively aligned with one another for propagation of N surface acoustic waves therebetween, an acoustic absorber disposed on said surface of the substrate between the paths of said N surface acoustic waves, the transducers of at least one of the transducer means being offset with respect to one another to provide N different path lengths for said surface acoustic waves to propagate the Nth harmonic of the fundamental frequency between said transducer means, the metallization ratio of the transducers being selected to provide a maximum amplitude of the surface acoustic waves at said Nth harmonic.

Figure 2:
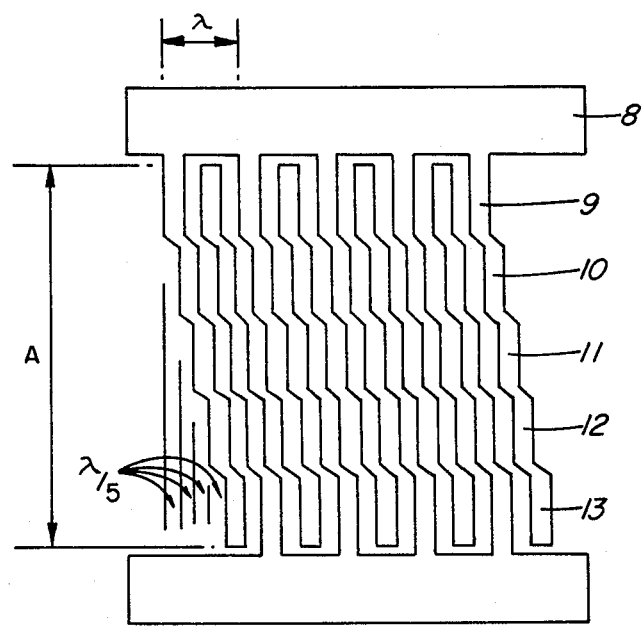
Figure 3:
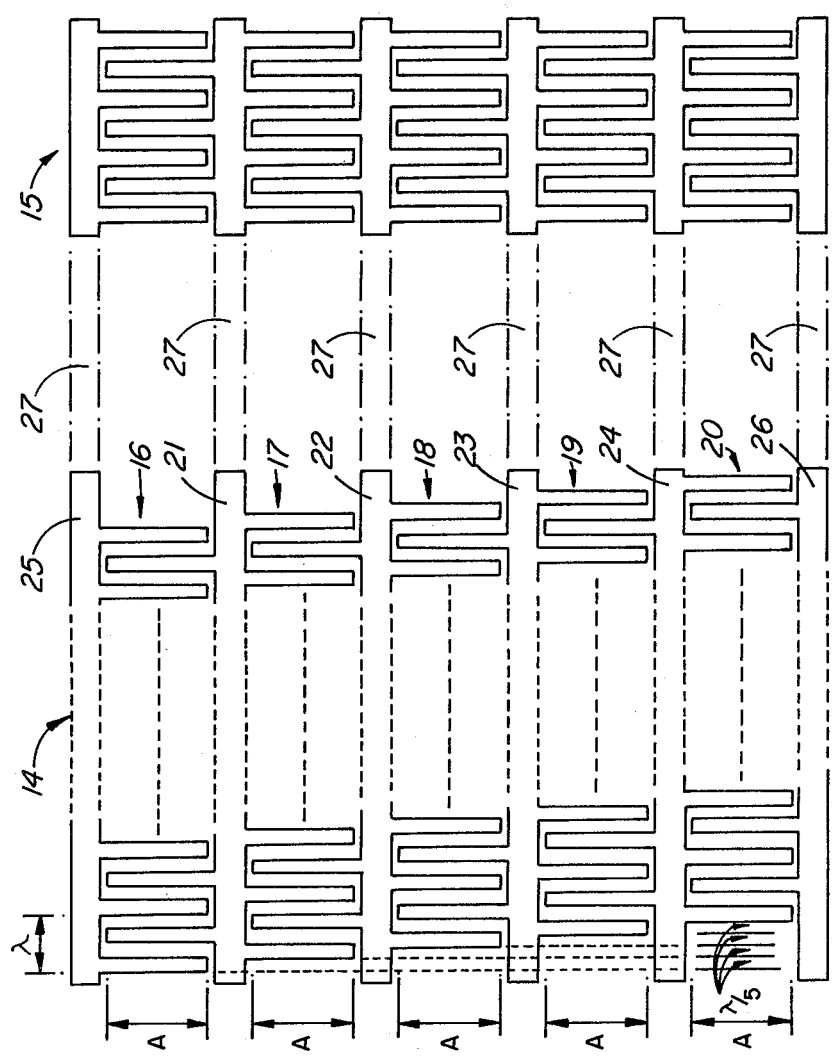
Figure 4:
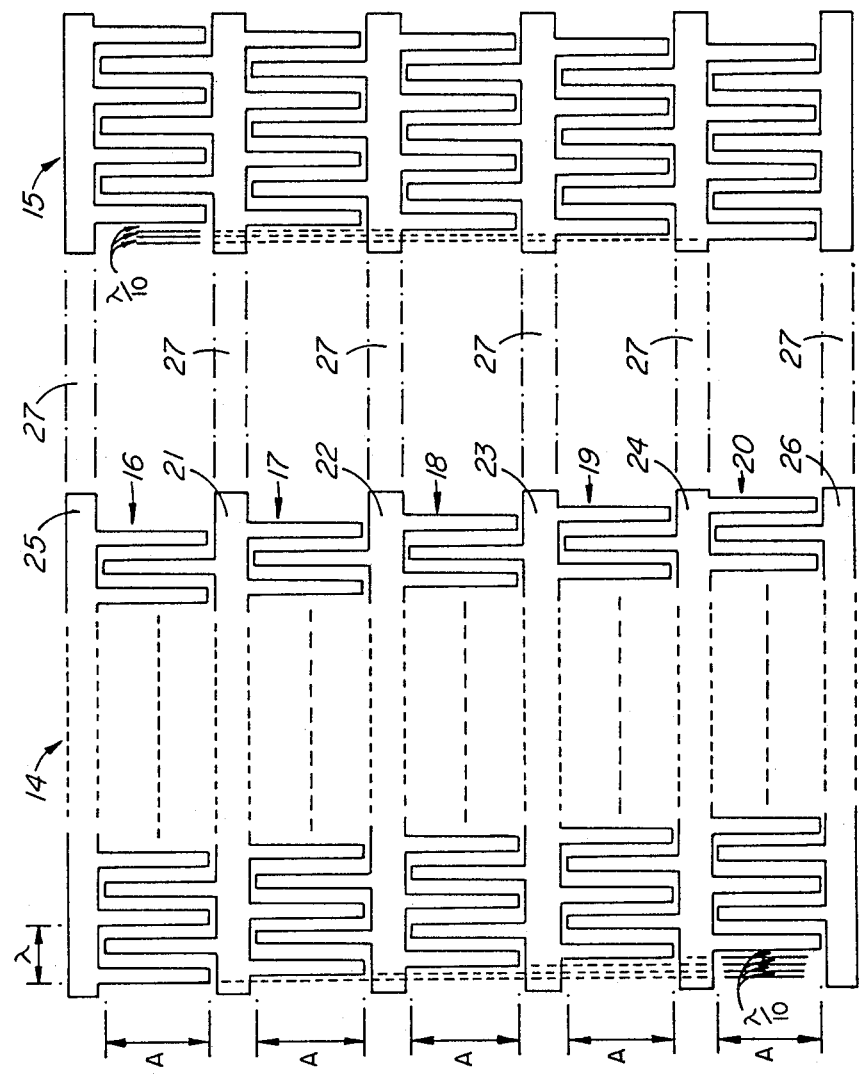

The invention will be further understood from the following description with reference to the accompanying drawings, in which:

FIG. 1 schematically illustrates a known form of delay-line oscillator using a SAW device to provide the delay line;

FIG. 2 schematically illustrates the form of a known step-type inter-digital transducer (IDT); and FIGS. 3 and 4 schematically illustrate IDTs of a SAW device in accordance with two embodiments of the invention.

Referring to FIG. 1, a known form of delay-line oscillator comprises an amplifier 1 whose output is connected to an output terminal 2 and is coupled to the input of the amplifier via a SAW device 3. The SAW device 3 comprises two IDTs 4 and 5 on a substrate 6 which is for example of ST-cut quartz. The IDTs 4 and 5 are aligned with one another and spaced apart in known manner to propagate a surface acoustic wave from the IDT 4 to the IDT 5 as indicated by an arrow 7. The spacing of the IDTs 4 and 5 determines the delay provided by the SAW device, which delay in conjunction with the bandpass filtering action of the IDTs determines the oscillation frequency of the oscillator. The pitch of the fingers of each of the IDTs 4 and 5 is selected to be equal to the wavelength $\lambda$ of the surface acoustic wave at the oscillation frequency. The number of fingers of each IDT determine the bandwidth of the IDT, and the aperture A of the IDT is determined in accordance with impedance matching considerations.

For a high frequency oscillator of the form shown in FIG. 1 the dimensions $\lambda$ and A would become very small. For example, for a 2.45 GHz oscillator to be used as a local oscillator in a microwave radio repeater, $\lambda \approx 1.3$ $\mu$m and A would be about 50 to 100 $\mu$m. The small value of $\lambda$ gives rise to significant difficulties in accurately defining the IDT patterns using photolithographic techniques, and the small aperture A leads to significant diffraction losses. In addition, the small cross-sectional size of the fingers of the IDTs results in significant power losses in the fingers. Furthermore, the maximum electric field which can be applied between the fingers of each IDT before breakdown of air occurs is very limited (about 3 volts/$\mu$m of space between adjacent fingers) so that the maximum power which can be coupled into the SAW device is very small.

In order to reduce at least some of these disadvantages, in the article by P. Naraine et al. already referred to, there is described a SAW step-type delay line in which the input IDT, corresponding to the IDT 4 in FIG. 1, can be of the form shown in FIG. 2. In such a transducer the fingers are offset along their lengths to form a plurality of steps across the aperture A. FIG. 2 shows an IDT 8 having fingers which are offset along their lengths to form five stepped parts 9, 10, 11, 12, and 13, the offsets each being one-fifth of the wavelength $\lambda$ for which the IDT is designed. If the IDT 8 of FIG. 2 is used with a conventional, non-stepped IDT of the form shown in FIG. 1 and designed for the same wavelength $\lambda$, only the fifth harmonic of the frequency corresponding to the wavelength $\lambda$ is propagated between the transducers, the fundamental frequency and other harmonics being suppressed. Other odd harmonics can be propagated in a similar manner using corresponding other numbers of steps for each finger and offsets of these steps. As explained in the article, even harmonics can be propagated using a three-finger stepped input IDT in conjunction with a Kerbel-type three-finger output IDT.

Thus harmonics of a fundamental frequency, for which the IDTs are designed, can be propagated in the SAW device, enabling the dimensions $\lambda$ and A for the IDTs to be increased to reduce some of the above-described disadvantages. However, even when this is done, the power which can be coupled into the SAW device is still restricted by voltage breakdown considerations. Furthermore, the still relatively small aperture A and the division of the fingers of the step-type IDT into as many steps as the harmonic order which is to be propagated, result in the problem of diffraction losses remaining.

FIG. 3 schematically illustrates transducer means 14 and 15, corresponding to the IDTs 4 and 5 respectively in FIG. 1 of a SAW device in accordance with an embodiment of the invention. For ease of comparison with FIG. 2, FIG. 3 also relates to a SAW device for propagating the fifth harmonic of a fundamental frequency whose surface acoustic wavelength is $\lambda$.

As shown in FIG. 3, each transducer means 14 and 15 comprises five individual IDTs which are electrically connected in series with one another. Thus for example the transducer means 14 comprises five IDTs 16, 17, 18, 19, and 20, which are electrically connected in series with one another by the provision of common metal tracks 21, 22, 23, and 24 therebetween. Further metal tracks 25 and 26 provide for connections to the transducer means 14.

The IDTs 16 to 20 are all similar to one another, each being of the known form as shown in FIG. 1 and being designed for operation at the fundamental frequency. The metallization ratio of each IDT, which is the ratio of the width of the fingers of the IDT to the width of the gaps between the fingers, is selected to be 0.5 as illustrated in FIG. 3 at which ratio the amplitude of the fifth harmonic surface acoustic wave is a maximum. Each of the IDTs 16 to 20 has an aperture A as shown in FIG. 3.

To facilitate propagation of the fifth harmonic and to suppress the fundamental frequency and other harmonics, the individual IDTs 16 to 20 of the transducer means 14 are offset with respect to one another by $\lambda/5$, or by one wavelength of the surface acoustic wave at the fifth harmonic, as illustrated in FIG. 3. Thus the five IDTs 16 to 20, together with the corresponding five IDTs of the transducer means 15 aligned therewith, define five different paths for propagation of surface acoustic waves between the transducer means. As the lengths of successive ones of these paths differ by $\lambda/5$, only the fifth harmonic of the fundamental frequency is efficiently propagated between the transducer means 14 and 15.

It should be appreciated that each of the transducer means 14 and 15 can withstand five times the applied voltage which can be withstood by the transducer 8 of FIG. 2, before voltage breakdown occurs, because the applied voltage is divided equally across the individual IDTs 16 to 20 so that each IDT is subjected to only one-fifth of the total applied voltage. As the power which can be coupled into the SAW device is proportional to the square of the applied voltage, the transducer means of FIG. 3 can couple 25 times the power which can be coupled by the transducer 8 of FIG. 2, and 625 times the power which can be coupled by the transducer 4 of FIG. 1, assuming that voltage breakdown is the only limiting factor.

Furthermore, as the aperture A of each IDT 16 to 20 in the transducer means 14 is as large as the aperture A for the whole transducer 8 in FIG. 2, and the fingers of the individual IDTs 16 to 20 are not stepped, diffraction losses in the SAW device of FIG. 3 are much smaller than those of devices using the IDT of FIG. 2.

The effects of diffraction can be further reduced in the SAW device of FIG. 3 by providing an acoustic absorber between the paths of the five surface acoustic waves. FIG. 3 shows in dash-dotted lines the location of acoustic absorber material 27 which overlies the metal tracks 21 to 26 of the transducer means 14 and corresponding tracks of the transducer means 15 and which also extends longitudinally between the aligned tracks. The acoustic absorber material 27 may for example be cermet or an ultra-violet light curable plastic material, which can be deposited over the substrate surface and selectively removed from the areas of the IDTs 16 to 20, the corresponding IDTs of the transducer means 15, and the surface acoustic wave-propagating areas therebetween.

By way of further example, it is observed that a SAW device using an ST-cut quartz substrate having transducer means of the form shown in FIG. 3, for a fundamental frequency of 490 MHz for operation at the fifth harmonic of 2.45 GHz, can have 5 IDTs 16 to 20 each having 300 finger pairs, with $\lambda = 6.44$ $\mu$m and $A = 264$ $\mu$m, the successive IDTs being offset by $\lambda/5 = 1.288$ $\mu$m, to provide a total impedance of about 50 $\Omega$ for the transducer means 14. The transducer means 15 can be similar to the transducer means 14 but may have fewer finger pairs, for example 150 finger pairs, with the center-to-center spacing of the transducer means 14 and 15 being about 300 $\lambda$, or about 1930 $\mu$m. The IDT fingers and metal tracks such as 21 to 26 can be of copper doped aluminum deposited on the substrate surface, with the metal tracks and correspondingly the acoustic absorber material 27 being about 100 to 200 $\mu$m wide. The overall size of the delay-line and bandpass filter thus formed on the surface of the substrate would be less than 4 mm. by 3 mm. Such a SAW device can conveniently be used in the manner illustrated in FIG. 1 to provide a low-noise frequency-stable microwave generator for use as a local oscillator in a radio repeater.

FIG. 4, in which similar references to those in FIG. 3 are used to denote similar parts, schematically illustrates an alternative arrangement of the transducer means 14 and 15, in which the IDTs of both transducer means are offset with respect to one another by $\lambda/10$, or by half of one wavelength of the surface acoustic wave at the fifth harmonic, to provide the different path lengths for the surface acoustic waves from the IDTs 16 to 20. Apart from this difference, the arrangement of FIG. 4 is the same as that of FIG. 3 and it operates in the same manner, so that further description of it is unnecessary.

Although the embodiments described above relate to propagation of the fifth harmonic of the fundamental frequency, other harmonics may be propagated in a similar manner, odd harmonics being propagated by changing the number N of IDTs in each transducer means to match the harmonic order N, with consequent changes in the offsets of the IDTs and if necessary in the metallization ratio of the IDTs, and even harmonics by using a plurality of series-connected three-finger IDTs which are offset as described above for the input transducer means, and a plurality of series-connected Kerbel-type three-finger output IDTs for the output transducer means.

Furthermore, the invention is not limited to SAW devices operating in harmonic modes, for the principles of the invention are also applicable to SAW devices operating in the fundamental frequency mode. Thus such a device may be provided with input and output transducer means, each comprising a plurality of IDTs which are not offset with respect to one another, in accordance with the principles of this invention to permit coupling into the device of more power than would be permitted by providing only single IDTs as shown in FIG. 1.

Accordingly, numerous changes, variations, and adaptations may be made to the described embodiments of the invention without departing from the scope of the claims, which should be liberally interpreted so as to obtain the benefit of all equivalents to which the invention is fairly entitled.

What is claimed is:

1. A surface acoustic wave device comprising a substrate and two transducer means disposed on a surface of the substrate for propagation of surface acoustic waves therebetween, each transducer means comprising a plurality of inter-digital transducers, electrically connected in series, for operation at a common frequency, wherein each transducer means comprises N inter-digital transducers, the 1st to Nth transducers of the two transducer means being respectively aligned with one another for propagation of N surface acoustic waves between the two transducer means, the transducers of at least one of the transducer means being offset with respect to one another to provide said N surface acoustic waves with N different path lengths between the two transducer means, said path lengths differing from one another to propagate the Nth harmonic of said common frequency between said two transducer means.

2. A surface acoustic wave device as claimed in claim 1 wherein the metallization ratio of the inter-digital transducers is selected to provide a maximum amplitude of the Nth harmonic of said common frequency of said surface acoustic waves.

3. A surface acoustic wave device as claimed in claim 1 and including an acoustic absorber disposed on said surface of the substrate between the paths of said N surface acoustic waves.

4. A surface acoustic wave device as claimed in claim 1, 2, or 3 wherein the N transducers of only one of the transducer means are offset with respect to one another by 1/N wavelengths of the surface acoustic waves at said common frequency to provide said different path lengths.

5. A surface acoustic wave device as claimed in claim 1, 2, or 3 wherein the transducers of both of the transducer means are offset with respect to one another to provide said different path lengths.

6. A surface acoustic wave device for propagation of surface acoustic waves at the Nth harmonic above a fundamental frequency, said device comprising a substrate and two transducer means disposed on a surface of the substrate, each transducer means comprising N series-connected inter-digital transducers each for operation at said fundamental frequency, the 1st to Nth transducers of the two transducer means being respectively aligned with one another for propagation of N surface acoustic waves therebetween, an acoustic absorber disposed on said surface of the substrate between the paths of said N surface acoustic waves, the transducers of at least one of the transducer means being offset with respect to one another to provide N different path lengths for said surface acoustic waves to propagate the Nth harmonic of the fundamental frequency between said transducer means, the metallization ratio of the transducers being selected to provide a maximum amplitude of the surface acoustic waves at said Nth harmonic.

7. A surface acoustic wave device as claimed in claim 6 wherein the N transducers of only one of the transducer means are offset with respect to one another by one wavelength of the surface acoustic waves of said Nth harmonic to provide said N different path lengths.

8. A surface acoustic wave device as claimed in claim 6 wherein the N transducers of each of the transducer means are offset with respect to one another by half of one wavelength of the surface acoustic waves at said Nth harmonic to provide said N different path lengths.

* * * * *